(12) United States Patent
Fujisawa et al.

(10) Patent No.: US 11,555,118 B2
(45) Date of Patent: Jan. 17, 2023

(54) CURABLE ORGANOPOLYSILOXANE COMPOSITION AND A PROTECTANT OR ADHESIVE COMPOSITION OF ELECTRIC/ELECTRONIC PARTS

(71) Applicant: DOW TORAY CO., LTD., Tokyo (JP)

(72) Inventors: Toyohiko Fujisawa, Ichihara (JP); Masayuki Onishi, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 980 days.

(21) Appl. No.: 16/607,020

(22) PCT Filed: Aug. 24, 2017

(86) PCT No.: PCT/JP2017/030265
§ 371 (c)(1),
(2) Date: Oct. 21, 2019

(87) PCT Pub. No.: WO2018/043270
PCT Pub. Date: Mar. 8, 2018

(65) Prior Publication Data
US 2020/0347229 A1 Nov. 5, 2020

(30) Foreign Application Priority Data

Sep. 1, 2016 (JP) .............................. JP2016-170919

(51) Int. Cl.
*C08L 83/04* (2006.01)
*C09D 183/04* (2006.01)
*C09J 183/04* (2006.01)
*H01L 23/29* (2006.01)
*H05K 5/06* (2006.01)

(52) U.S. Cl.
CPC ............ *C08L 83/04* (2013.01); *C09D 183/04* (2013.01); *C09J 183/04* (2013.01); *H01L 23/296* (2013.01); *H05K 5/065* (2013.01); *C08L 2203/206* (2013.01); *C08L 2205/025* (2013.01); *C08L 2205/035* (2013.01)

(58) Field of Classification Search
None
See application file for complete search history.

(56) References Cited

U.S. PATENT DOCUMENTS

| | | |
|---|---|---|
| 3,837,876 A | 9/1974 | Mayuzumi et al. |
| 4,302,342 A | 11/1981 | Demoures et al. |
| 2002/0010245 A1 | 1/2002 | Enami et al. |
| 2009/0105441 A1 | 4/2009 | Ushio et al. |
| 2011/0224344 A1 | 9/2011 | Fujisawa et al. |
| 2011/0269918 A1 | 11/2011 | Hamamoto et al. |
| 2013/0137613 A1 | 5/2013 | Kato et al. |
| 2014/0066570 A1 | 3/2014 | Kodama et al. |
| 2015/0240141 A1* | 8/2015 | Tsuchida ................ C09J 183/04 428/355 R |
| 2017/0121462 A1 | 5/2017 | Fujisawa et al. |

FOREIGN PATENT DOCUMENTS

| | | |
|---|---|---|
| EP | 0460698 A2 | 12/1991 |
| JP | S528854 B2 | 3/1977 |
| JP | S555991 A | 1/1980 |
| JP | H441562 A | 2/1992 |
| JP | H10195085 A | 7/1998 |
| JP | 2001348483 A | 12/2001 |
| JP | 2002170978 A | 6/2002 |
| JP | 2006348119 A | 12/2006 |
| JP | 2007235013 A | 9/2007 |
| JP | 2009135105 A | 6/2009 |
| JP | 2010070599 A | 4/2010 |
| JP | 2011246693 A | 12/2011 |
| JP | 2012007057 A | 1/2012 |
| JP | 2012204016 A | 10/2012 |
| JP | 2012219113 A | 11/2012 |
| JP | 2014114446 A | 6/2014 |
| WO | 2015155950 A1 | 10/2015 |
| WO | 201638836 A1 | 3/2016 |

OTHER PUBLICATIONS

Machine assisted English translation of JPH10195085A obtained from https://worldwide.espacenet.com on Jul. 15, 2021, 17 pages.
Machine assisted English translation of JP2002170978A obtained from https://worldwide.espacenet.com on Jul. 15, 2021, 14 pages.
Machine assisted English translation of JP2007235013A obtained from https://worldwide.espacenet.com on Jul. 15, 2021, 16 pages.
Machine assisted English translation of JP2009135105A obtained from https://worldwide.espacenet.com on Jul. 15, 2021, 13 pages.

(Continued)

*Primary Examiner* — Robert T Butcher
(74) *Attorney, Agent, or Firm* — Warner Norcross + Judd LLP

(57) ABSTRACT

Provided is a curable organopolysiloxane composition which has a particularly excellent effect of improving initial adhesiveness in small amounts and a thin layer with respect to various base materials, in addition to being able to achieve particularly excellent adhesive durability and high adhesive strength after curing. The curable organopolysiloxane composition comprises: (A) an organopolysiloxane having at least two alkenyl groups per one molecule; (B) a trialcoxysilyl containing siloxane having one silicon atom-bonded hydrogen atom and at least one trialcoxysilyl group per one molecule; (C) a chain or cyclic organopolysiloxane having at least two silicon atom-bonded hydrogen atoms per one molecule; (D) a chain organopolysiloxane having at least three silicon atom-bonded hydrogen atoms per one molecule; (E) a catalyst for a hydrosilylation reaction; (F) a catalyst for a condensation reaction; and (G) an adhesion promoter.

12 Claims, No Drawings

(56) References Cited

OTHER PUBLICATIONS

Machine assisted English translation of JP2012204016A obtained from https://worldwide.espacenet.com on Jul. 15, 2021, 15 pages.
English translation of International Search Report for PCT/JP2017/030265 dated Nov. 7, 2017, 2 pages.
Machine assisted English translation of JP2014114446A obtained from https://patents.google.com on Jan. 19, 2020, 20 pages.
Machine assisted English translation of WO201638836A1 obtained from https://patentsgoogle.com on Jan. 19, 2020, 27 pages.

* cited by examiner

CURABLE ORGANOPOLYSILOXANE COMPOSITION AND A PROTECTANT OR ADHESIVE COMPOSITION OF ELECTRIC/ELECTRONIC PARTS

CROSS-REFERENCE TO RELATED APPLICATIONS

This application is the National Stage of International Appl. No. PCT/JP2017/030265 filed on 24 Aug. 2017, which claims priority to and all advantages of Japanese Appl. No. 2016-170919 filed on 1 Sep. 2016, the content of which is hereby incorporated by reference.

TECHNICAL FIELD

The present invention relates to a curable organopolysiloxane composition which is easily cured by warming at from room temperature to 50° C., in addition to having particularly excellent adhesiveness in a thin layer with respect to various base materials, and further relates to a protectant or adhesive composition of electric/electronic parts including this curable organopolysiloxane composition, as well as electric/electronic equipment, wherein electric/electronic parts are encapsulated or sealed by these curable organopolysiloxane compositions.

BACKGROUND ART

While curable organopolysiloxane compositions are widely used as protectant compositions of electric/electronic parts, in terms of their reliability and durability as protective materials, they are required to exhibit excellent self-adhesiveness to the base materials they contact during curing. In particular, the miniaturization, multiple purposes, compactification, and weight reduction of electric/electronic parts have recently been required, shapes corresponding to various uses have become complicated, and adhesives or protectants used in adhesive forms (such as adhesion in small amounts and adhesion in a thin layer) different from conventional ones have been required.

For example, the present applicants propose a hydrosilylation reaction curing curable organopolysiloxane composition containing an organopolysiloxane having a specific alkoxysilyl group and alkenyl group per one molecule, which has excellent adhesiveness to uncleaned aluminum die casts, etc. and is cured by heating at approximately 100° C. (Patent Document 1). Moreover, the same document describes that a titanium compound, etc. can be used as an adhesion promoting catalyst. Unfortunately, the curable organopolysiloxane composition is a hydrosilylation reaction curing composition and is not cured if not heated at approximately 100° C., with the adhesiveness to various base materials still having room for improvement. In addition, while such a composition can achieve adhesive strength as a thick film, problematically, in an adhesive form such as a thin layer, it tends not to achieve sufficient initial adhesiveness as well as adhesive strength after curing.

In contrast, as a room temperature curable silicone rubber composition which is cured at room temperature upon contacting moisture in the air and exhibits good adhesiveness to the base materials it contacts during curing, the present applicants propose a room temperature curable silicone rubber composition which includes a diorganopolysiloxane having a specific alkoxysilyl group such as a trimethoxysilylethyl containing group, an organopolysiloxane not having this alkoxysilyl group or a hydroxyl group, an alkoxysilane (serving as a crosslinking agent) or a hydrolysate thereof, and a catalyst for a condensation reaction (Patent Document 2). Further, the present applicants propose a curable organopolysiloxane composition which has excellent curing properties at low temperatures as well as excellent initial adhesiveness to an organic resin, wherein, after curing, in order to achieve high adhesive strength, an organopolysiloxane having a specific alkoxysilyl group serves as the main agent, with a hydrosilylation reaction catalyst and a catalyst for a condensation reaction used in combination (Patent Document 3). Moreover, Patent Document 4 proposes a curable organopolysiloxane composition including a linear organohydrogen polysiloxane, wherein one terminal is blocked by hydrogen atoms bonded to silicon atoms, while the other terminal is blocked by hydroxyl groups or alkoxy groups bonded to silicon atoms. Unfortunately, even these curable compositions still problematically have room for improvement in terms of adhesion properties when applied in small amounts and a thin layer, wherein some base materials do not form a firm bond with a thin layer adhesive, easily leading to interfacial peeling.

PRIOR ART DOCUMENTS

Patent Documents

[Patent Document 1] JP 2006-348119 A
[Patent Document 2] JP 2012-219113 A
[Patent Document 3] WO 2015/155950
[Patent Document 4] JP 2011-246693 A (JP 5505991 B)

SUMMARY OF THE INVENTION

Problems to be Solved by the Invention

The present invention has been created in order to solve the abovementioned problem, with the object of providing a curable organopolysiloxane composition which is easily cured by warming at from room temperature to 50° C. even when applied particularly in small amounts or a thin layer, has excellent initial adhesiveness to various base materials it contacts during curing, particularly to organic resins such as an uncleaned aluminum die cast, polybutylene terephthalate (PBT) resin, and polyphenylene sulfide (PPS) resin, and after curing, achieves high adhesive strength and tends not to cause problems such as peeling.

In particular, the object of the present invention is to provide a protectant or adhesive composition of electric/electronic parts, wherein the use of the curable organopolysiloxane composition enables the maintenance of the reliability/durability of electric/electronic parts for extended periods of time. Moreover, the object of the present invention is to provide such electric/electronic parts having excellent reliability/durability. Further, the object of the present invention is to provide electric/electronic parts including a cured product obtained by applying the curable organopolysiloxane composition in a thin layer and curing the composition.

Means for Solving the Problems

As a result of extensive research, the present inventors found that the abovementioned problem can be solved by a curable organopolysiloxane composition containing the following components (A) to (G), leading to the present invention.

(A) 100 parts by mass of an organopolysiloxane having at least two alkenyl groups per one molecule;

(B) 0.05 to 10 parts by mass of a trialcoxysilyl containing siloxane having one silicon atom-bonded hydrogen atom and at least one trialcoxysilyl group per one molecule;

(C) 0.1 to 30 parts by mass of a chain or cyclic organopolysiloxane having at least two silicon atom-bonded hydrogen atoms per one molecule;

(D) 0.1 to 10 parts by mass of a chain organopolysiloxane having at least three silicon atom-bonded hydrogen atoms per one molecule, {wherein the total amount of silicon atom-bonded hydrogen atoms of (B), (C), and (D) with respect to the number of the alkenyl groups in all the components is 0.3 to 10};

(E) a catalyst amount of a catalyst for a hydrosilylation reaction;

(F) a catalyst amount of a catalyst for a condensation reaction; and (G) an adhesion promoter.

Further, the present inventors found that the abovementioned problem can be solved by a curable organopolysiloxane composition, wherein the content of the organopolysiloxane having an alkoxysilyl containing group corresponding to an organopolysiloxane obtained by reacting components (B) and (A) in advance is less than 5.0 mass %, leading to the present invention.

That is, the object of the present invention is achieved by the following curable organopolysiloxane composition.

[1] A curable organopolysiloxane composition, containing the following components (A) to (G):

(A) 100 parts by mass of an organopolysiloxane having at least two alkenyl groups per one molecule;

(B) 0.05 to 10 parts by mass of a trialcoxysilyl containing siloxane having one silicon atom-bonded hydrogen atom and at least one trialcoxysilyl group per one molecule;

(C) 0.1 to 30 parts by mass of a chain or cyclic organopolysiloxane having at least two silicon atom-bonded hydrogen atoms per one molecule;

(D) 0.1 to 10 parts by mass of a chain organopolysiloxane having at least three silicon atom-bonded hydrogen atoms per one molecule, {wherein the total amount of the silicon atom-bonded hydrogen atoms of (B), (C), and (D) with respect to the number of the alkenyl groups in all the components is 0.3 to 10};

(E) a catalyst for a hydrosilylation reaction in a catalyst amount; and (F) a catalyst amount of a catalyst for a condensation reaction;

(G) an adhesion promoter.

[2] The curable organopolysiloxane composition according to [1], wherein component (B) is a trialcoxysilyl containing siloxane represented by the following formula.

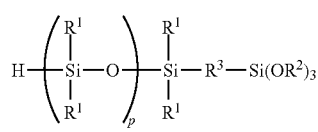

[Formula 1]

(wherein $R^1$ is the same or different monovalent hydrocarbon group not having an aliphatic unsaturated bond, $R^2$ is an alkyl group, $R^3$ is an alkylene group, and p is an integer of 1 to 50.)

[3] The curable organopolysiloxane composition according to [1] or [2], wherein component (B) is a trialcoxysilyl containing siloxane represented by the following formula.

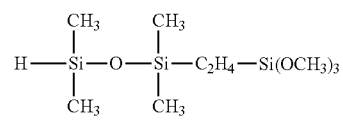

[Formula 2]

[4] The curable organopolysiloxane composition according to any one of [1] to [3], wherein the content of the organopolysiloxane having an alkoxysilyl containing group represented by the general formula of at least one silicon atom bond:

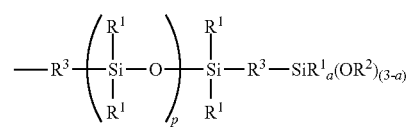

[Formula 3]

(wherein $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50)

is less than 5.0 mass % per one molecule with respect to the overall composition.

[5] The curable organopolysiloxane composition according to [1], wherein the adhesion promoter (G) is one or two or more selected from the following components (g1) to (g4):

(g1) a reaction mixture between an amino group containing organoalkoxysilane and an epoxy group containing organoalkoxysilane;

(g2) an organic compound having at least two alkoxysilyl groups per one molecule, in addition to containing bonds other than a silicon-oxygen bond between these silyl groups;

(g3) an epoxy group containing silane represented by the general formula:

$$R^a{}_n Si(OR^b)_{4-n}$$

(wherein $R^a$ is a monovalent epoxy group containing organic group, $R^b$ is an alkyl group having a carbon number of 1 to 6, or a hydrogen atom, and n is a number within the range of 1 to 3.)

or a partially hydrolyzed condensate thereof; and (g4) an alkoxysilane (except those having an epoxy group containing organic group), or a partially hydrolyzed condensate thereof.

[6] The curable organopolysiloxane composition according to any one of [1] to [5], further containing an inorganic filler (H).

[7] The curable organopolysiloxane composition according to any one of [1] to [6], which is room temperature curable.

[8] The curable organopolysiloxane composition according to any one of [1] to [7], which is a two-liquid type curable organopolysiloxane composition.

[9] The two-liquid type curable organopolysiloxane composition according to [8], wherein a one-liquid component contains at least components (E) and (F), and optionally contains part of component (A), while a two-liquid component contains at least components (B), (C), (D), and (G), as well as the remaining amount of component (A).

Moreover, the objects of the present invention are achieved by:

[10] A protectant or adhesive composition of electric/electronic parts, including: the curable organopolysiloxane composition according to any one of said [1] to [9].

[11] Electric/electronic equipment, wherein electric/electronic parts are obtained by encapsulating or sealing the curable organopolysiloxane composition according to any one of said [1] to [9].

[12] Electric/electronic equipment, including a cured product obtained by curing the curable organopolysiloxane composition according to any one of said [1] to [9].

[13] The electric/electronic equipment according to [12], wherein the thickness of the cured product is within the range of 10 to 500 μm.

Note that the object of the present invention may be achieved by using the curable organopolysiloxane composition as a protectant or adhesive of electric/electronic parts. Similarly, the object of the present invention also may be achieved by the curable organopolysiloxane composition, a method for protecting or adhering electric/electronic parts, or electric/electronic equipment including the cured product of the curable organopolysiloxane composition.

Effects of the Invention

The curable organopolysiloxane composition according to the present invention enables the provision of a curable organopolysiloxane composition which is easily cured by warming at from room temperature to 50° C. even when applied particularly in small amounts or a thin layer, has excellent initial adhesiveness to various base materials it contacts during curing, particularly to organic resins such as an uncleaned aluminum die cast, polybutylene terephthalate (PBT) resin, and polyphenylene sulfide (PPS) resin, and achieves high adhesive strength after curing.

Moreover, the use of the curable organopolysiloxane composition according to the present invention enables the provision of a protectant or adhesive composition of electric/electronic parts which is cured at from room temperature to 50° C., has excellent initial adhesiveness and adhesive durability to aluminum die casts and resin material, and can maintain the reliability/durability of electric/electronic parts for extended periods of time. Moreover, the present invention enables the provision of such electric/electronic parts having excellent reliability/durability. Further, the present invention enables the provision of electric/electronic parts including a cured product obtained by applying the curable organopolysiloxane composition in a thin layer and curing the composition.

MODE FOR CARRYING OUT THE INVENTION

The curable organopolysiloxane composition according to the present invention is a composition including both a catalyst for a hydrosilylation reaction and a catalyst for a condensation reaction, and in addition to the organopolysiloxane containing an alkenyl group serving as the main agent, has one silicon atom-bonded hydrogen atom per one molecule, contains a alkoxysilyl containing siloxane having at least one trialcoxysilyl group, and contains two organohydrogen polysiloxanes having different numbers of silicon atom-bonded hydrogen atoms. Here, for example, unlike the composition disclosed in Patent Document 3, etc., when the alkoxysilyl containing siloxane (not in the form reacted with the organopolysiloxane containing an alkenyl group in advance, but as a reactive raw material) is added to the abovementioned curing system, it achieves particularly excellent initial adhesiveness and adhesive durability in the curing form in small amounts/a thin layer. Hereinafter, each component will be described.

Component (A)

Component (A) is an organopolysiloxane having at least two alkenyl groups per one molecule and serving as the main agent of the present composition. This component (A) is preferably an organopolysiloxane having at least two alkenyl groups per one molecule and not having the below mentioned alkoxysilyl containing group in a molecule, with component (A) preferably added to the composition without being reacted with component (B) in advance.

Exemplary alkenyl groups in component (A) include a vinyl group, allyl group, butenyl group, pentenyl group, and hexenyl group, with a vinyl group and hexenyl group preferable. While not particularly limited thereto, exemplary bonding positions of this alkenyl group may particularly include a molecular chain terminal or a molecular chain side chain. Moreover, exemplary organic groups bonded to silicon atoms other than the alkenyl group in component (A) may include monovalent hydrocarbon groups not having an aliphatic unsaturated bond, such as an alkyl group, cycloalkyl group, aryl group, aralkyl group, and halogenated alkyl group, etc., with an alkyl group and aryl group preferable, and with a methyl group and phenyl group particularly preferable. While the molecular structure of component (A) is not particularly limited, examples thereof include a linear structure, partially branched linear structure, branched structure, cyclic structure, network structure, and dendritic structure. Component (A) may be a mixture of two or more having these molecular structures. In particular, the molecular structure of component (A) preferably has a linear or resin structure, with linear component (A) and resin component (A) particularly preferably used in combination. Moreover, while not particularly limited thereto, the viscosity of component (A) at 25° C. is, for example, preferably within the range of 20 to 1,000,000 mPa/s, particularly preferably within the range of 100 to 100,000 mPa/s. This is because, if the viscosity at 25° C. is less than the lower limit of the abovementioned range, the physical properties of the obtained cured product, particularly flexibility and elongation, may significantly decrease; in contrast, if it exceeds the upper limit of the abovementioned range, the viscosity of the obtained composition may increase, significantly deteriorating the handleability.

Exemplary components (A) include: a dimethylsiloxane/methylvinylsiloxane copolymer blocked by a trimethylsiloxy group at both terminals of a molecular chain, a dimethylsiloxane/methylvinylsiloxane/methylphenylsiloxane copolymer blocked by a trimethylsiloxy group at both terminals of a molecular chain, a dimethylpolysiloxane blocked by a dimethylvinylsiloxy group at both terminals of a molecular chain, a methylphenylpolysiloxane blocked by a dimethylvinylsiloxy group at both terminals of a molecular chain, a dimethylsiloxane/methylvinylsiloxane copolymer blocked by a dimethylvinylsiloxy group at both terminals of a molecular chain, a dimethylsiloxane/methylvinylsiloxane copolymer blocked by a dimethylphenylsiloxy group at both terminals of a molecular chain, and a dimethylpolysiloxane blocked by a methylvinylphenylsiloxy group at both terminals of a molecular chain.

Component (B)

Component (B) is a characteristic component according to the present invention and is a trialcoxysilyl containing siloxane having one silicon atom-bonded hydrogen atom and at least one trialcoxysilyl group per one molecule, in addition to also being a component which achieves firm and flexible adhesion to base materials in terms of both adhesiveness at low temperatures and the adhesive form in small amounts and a thin layer. Component (B) has a trialcoxysilyl group, accordingly giving it excellent reactivity, with multiple condensation reaction functional groups simultaneously reacted. Therefore, in contrast to an organohydrogen polysiloxane having a hydroxyl group and alkoxy group, thin layer adhesiveness is advantageously significantly improved.

Because this trialcoxysilyl containing siloxane has silicon atom-bonded hydrogen atoms in a molecule, it reacts with component (A) together with other crosslinking agents (components (C) and (D)) during the curing reaction and is incorporated into the cured product. Here, if component (B) has been subjected to an addition reaction with component (A) in advance, the technical effects of the present invention may not be able to be sufficiently achieved. Moreover, the trialcoxysilyl group is preferably a trimethoxysilyl group or triethoxysilyl group, wherein a group other than the silicon atom-bonded hydrogen atoms and alkoxysilyl group in component (B) is preferably a nonreactive functional group selected from an alkyl group or aryl group.

Suitably, component (B) is an alkoxysilyl containing siloxane having a silicon atom-bonded hydrogen atoms and alkoxysilyl group at both terminals of a polysiloxane represented by the following formula.

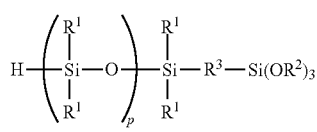

[Formula 4]

wherein $R^1$ is the same or different monovalent hydrocarbon group not having an aliphatic unsaturated bond, $R^2$ is an alkyl group, $R^3$ is an alkylene group, and p is an integer of 1 to 50.

In the above formula, $R^1$ represents the same or different monovalent hydrocarbon group not having an aliphatic unsaturated bond, with examples thereof including: alkyl groups such as a methyl group, ethyl group, propyl group, butyl group, pentyl group, hexyl group, heptyl group, octyl group, nonyl group, decyl group, and octadecyl group; cycloalkyl groups such as a cyclopentyl group and cyclohexyl group; aryl groups such as a phenyl group, tolyl group, xylyl group, and naphthyl group; aralkyl groups such as a benzyl group, phenethyl group, and phenylpropyl group; halogenated alkyl groups such as a 3-chloropropyl group and 3,3,3-trifloropropyl group, with an alkyl group and aryl group preferable, with a methyl group and phenyl group particularly preferable. Moreover, in the above formula, $R^2$ is an alkyl group, with examples thereof including a methyl group, ethyl group, propyl group, butyl group, pentyl group, and hexyl group, with a methyl group or ethyl group preferable. $R^3$ is an alkylene group, preferably an alkylene group having a carbon number of 2 to 10, particularly preferably an ethylene group or propylene group. Moreover, in the above formula, p is an integer of 1 to 50, preferably an integer of 1 to 10, particularly preferably an integer of 1 to 5.

Exemplary such components (B) may include an alkoxysilyl containing siloxane represented by the formula:

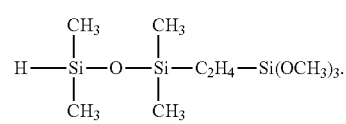

[Formula 5]

an alkoxysilyl containing siloxane represented by the formula:

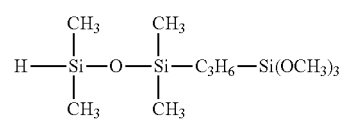

[Formula 6]

an alkoxysilyl containing siloxane represented by the formula:

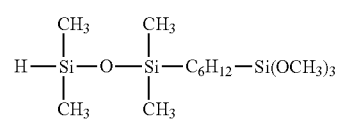

[Formula 7]

or an alkoxysilyl containing siloxane represented by the formula:

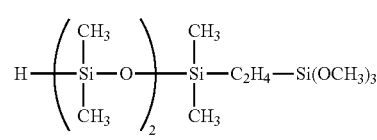

[Formula 8]

One of these alkoxysilyl containing siloxanes may be used or two or more thereof may be used in combination, or part or all of methyl groups may be substituted with other alkyl groups, halogenated alkyl groups, aryl groups, etc.

In terms of the technical effects, component (B) is suitably a trimethoxysilyl group containing disiloxane represented by the formula:

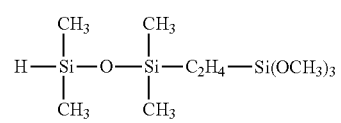

[Formula 9]

Note that, in terms of the technical effects, it is important that the present invention composition blends the above-mentioned alkoxysilyl containing siloxane with component (A) in an unreacted form. For example, if the organopolysiloxane obtained by the addition reaction with the abovementioned alkoxysilyl containing siloxane component (A) is added in a reaction equivalent amount into the present invention composition, adhesion properties particularly in small amounts and a thin layer are not sufficiently improved, with poor peeling and adhesion easily generated.

More specifically, the content of the organopolysiloxane having an alkoxysilyl containing group represented by the general formula of at least one silicon atom bond:

[Formula 10]

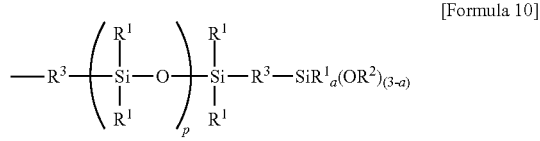

(wherein $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50)
is less than 5.0 mass %, suitably less than 3.0 mass %, more suitably less than 1.0 mass %, per one molecule with respect to the overall composition. Most suitably, the present invention composition does not contain the alkoxysilyl containing group having the organopolysiloxane as mentioned above. Note that the abovementioned functional groups exemplified as $R^1$, $R^2$, and $R^3$, as well as a and p, are the same as each functional group in component (B).

Such an organopolysiloxane having an alkoxysilyl containing group may be temporarily formed in an addition reaction between components (A) and (B) along with the progress of the curing reaction of the present composition, but progresses as a competitive reaction with other crosslinking agents (components (C) and (D), etc.) in the curing reaction, unlike the addition of a pre-reactant. From this, it is assumed that unlike the addition of an equivalent amount of the pre-reactant to the composition, the technical effects of improving adhesion properties, etc. are exerted as a result of a random (nonselective) progress of the reaction between components (B) and (A) in the curing reaction alongside other crosslinking reactions.

Component (C)

The present invention composition characteristically uses two crosslinking agents in combination. Component (C) is a chain or cyclic organopolysiloxane having two silicon atombonded hydrogen atoms per one molecule (with the crosslinking reaction points limited to two), and mainly reacts with component (A) as a chain length extender to form a long chain molecular structure including a long polysiloxane in a cured product. Such a long chain molecular structure imparts flexibility and trackability to the cured product and is expected to improve adhesion strength and adherence in itself when adhered to resin, etc.

Exemplary organic groups bonded to silicon atoms in component (C) may include monovalent hydrocarbon groups not having an aliphatic unsaturated bond such as an alkyl group, cycloalkyl group, aryl group, aralkyl group, and halogenated alkyl group, with an alkyl group, aryl group, hydroxyl group, alkoxy group, or epoxy group preferable, and with a methyl group, a phenyl group, methoxy group, ethoxy group, or epoxy group particularly preferable. The molecular structure of component (C) is a chain or cyclic structure, with examples thereof including a linear structure, partially branched linear structure, branched structure, or cyclic structure, with a linear structure preferable. Moreover, while not particularly limited thereto, the viscosity of component (C) at 25° C. is preferably within the range of 1 to 10,000 mPa/s, more suitably within the range of 1 to 1,000 mPa/s, particularly suitably within the range of 1 to 500 mPa/s.

Component (C) is suitably a linear organopolysiloxane having silicon atom-bonded hydrogen atoms only at both terminals of a molecular chain or a cyclic organopolysiloxane having two silicon atom-bonded hydrogen atoms. Exemplary linear components (C) may include a dimethylpolysiloxane blocked by a dimethylhydrogen siloxy group at both terminals of a molecular chain, a methylphenylpolysiloxane blocked by a dimethylhydrogen siloxy group at both terminals of a molecular chain, a dimethylsiloxane/methylphenylsiloxane copolymer blocked by a dimethylhydrogen siloxy group at both terminals of a molecular chain, a diphenylpolysiloxane blocked by a dimethylhydrogen siloxy group at both terminals of a molecular chain, etc.

Similarly, cyclic component (C) is a polysiloxane configured by diorganosiloxy units and having two methylhydrogen siloxy units ($CH_3(H)SiO_{2/2}$), with examples thereof suitably including a cyclic trisiloxane (trimer), cyclic tetrasiloxane (tetramer), and cyclic pentasiloxane (pentamer). These cyclic siloxanes may be cyclic siloxanes including, as other diorganosiloxy units, one or two or more siloxy units selected from an alkoxymethylsiloxane unit ($CH_3$(Alkoxy) $SiO_{2/2}$), epoxy methylsiloxy unit ($CH_3$(Epoxy)$SiO_{2/2}$), dimethylsiloxy unit (($CH_3)_2SiO_{2/2}$), diphenylsiloxy unit (($C_6H_5)_2SiO_{2/2}$), and phenylmethylsiloxy unit (($C_6H_5$)($CH_3$)$SiO_{2/2}$).

In terms of the technical effects of the present invention, component (C) is suitably a methylphenylpolysiloxane blocked by a dimethylhydrogen siloxy group at both terminals of a molecular chain, a diphenylpolysiloxane blocked by a dimethylhydrogen siloxy group at both terminals of a molecular chain, or a dimethylpolysiloxane blocked by a dimethylhydrogen siloxy group at both terminals of a molecular chain, wherein the viscosity at 25° C. is within the range of 1 to 50 mPa/s. Similarly, component (C) has two methylhydrogen siloxy units ($CH_3(H)SiO_{2/2}$) and may be a cyclic tetrasiloxane (tetramer) or a cyclic pentasiloxane (pentamer) containing one or two or more selected from an epoxy methylsiloxy unit ($CH_3$(Epoxy)$SiO_{2/2}$) and alkoxymethylsiloxane unit ($CH_3$(Alkoxy)$SiO_{2/2}$), with a cyclic tetrasiloxane represented by

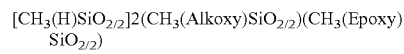

particularly preferable. Note that the alkoxy group is suitably a methoxy group or ethoxy group, while the epoxy group is suitably a glycidoxy group.

Component (D)

Component (D) serves as the main crosslinking agent of the composition of the present invention and is a chain organopolysiloxane having at least three silicon atombonded hydrogen atoms per one molecule. Component (D) has a large number of crosslinking reaction points and accordingly forms a dense three-dimensional crosslinking structure with component (A) in the curing reaction of the composition according to the present invention, achieving the strength of a cured product and firm adhesiveness (adhesive durability) with base materials.

Exemplary organic groups bonded to silicon atoms in component (D) may include monovalent hydrocarbon groups not having an aliphatic unsaturated bond such as an alkyl group, cycloalkyl group, aryl group, aralkyl group, and halogenated alkyl group, with an alkyl group and aryl group preferable, and a methyl group and phenyl group particularly preferable. The molecular structure of component (D) is a chain structure, with examples thereof including a linear structure, partially branched linear structure, or branched structure, with a linear structure preferable. While not particularly limited thereto, the viscosity of component (D) at 25° C. is preferably within the range of 1 to 10,000 mPa/s.

Exemplary components (D) may include a methylhydrogen polysiloxane blocked by a trimethylsiloxy group at both terminals of a molecular chain, a methylhydrogen siloxane/dimethylsiloxane copolymer blocked by a trimethylsiloxy group at both terminals of a molecular chain, a methylhydrogen siloxane/dimethylsiloxane copolymer blocked by a dimethylhydrogen siloxy group at both terminals of a molecular chain, and mixtures of two or more of these organopolysiloxanes. In the present invention, component (D) is particularly preferably a methylhydrogen siloxane/dimethylsiloxane copolymer blocked by a trimethylsiloxy group at both terminals of a molecular chain (wherein, the viscosity at 25° C. is 1 to 500 mPa/s) in terms of improving the initial adhesiveness and adhesive durability to an aluminum die cast and resin material.

Ratio and Content of the SiH Group and the Alkenyl Group

The content of components (B), (C), and (D) (hereinafter, "SiH group containing components") is an amount of silicon atom-bonded hydrogen atoms in this component within the range of 0.3 to 10 with respect to one alkenyl group in component (A), preferably an amount within the range of 0.5 to 3.0, and more preferably an amount within the range of 0.8 to 2.0, in terms of thin layer adhesiveness. This is because, if the content of the abovementioned SiH group containing component is less than the lower limit of the abovementioned range, the obtained composition becomes no longer sufficiently cured; in contrast, if it exceeds the upper limit of the abovementioned range, the obtained composition may generate hydrogen gas during curing, significantly decreasing the heat resistance of the obtained cured product.

In the present invention composition, with respect to 100 parts by mass of component (A), the content of component (B) is 0.05 to 10 parts by mass, the content of component (C) is 0.1 to 30 parts by mass, and the content of component (D) is 0.1 to 10 parts by mass. Suitably, the content of component (B) is 0.2 to 10 parts by mass, the content of component (C) is 0.5 to 20 parts by mass, and the content of component (D) is 0.2 to 5 parts by mass. If components (B) and (C) are less than the lower limit of the abovementioned range, the adhesiveness of the obtained composition in a thin layer is insufficient; in contrast, if they exceed the upper limit of the abovementioned range, the elastic modulus of the composition tends to decrease, while the adhesive strength tends to significantly decrease even upon a cohesive failure. Moreover, if component (D) is less than the abovementioned lower limit, the obtained composition tends to become no longer sufficiently cured; in contrast, if it exceeds the upper limit of the abovementioned range, the obtained composition may generate hydrogen gas during curing, causing foaming.

Components (E) and (F)

The curable organopolysiloxane composition according to the present invention includes, in addition to said components (A) to (D), two different curing catalysts: (E) the catalyst amount of a catalyst for a hydrosilylation reaction; and (F) the catalyst amount of a catalyst for a condensation reaction. The technical effects are achieved such that when such two catalysts are used in combination with said each component, they are easily cured by warming at from room temperature to 50° C., and have excellent adhesiveness to various base materials.

Component (E) is the catalyst amount of a catalyst for a hydrosilylation reaction and serves as a component for promoting the hydrosilylation reaction and curing the present composition. Exemplary such components may include platinum based catalysts such as platinum black, platinum-supporting activated carbon, platinum-supporting silica fine powder, chloroplatinic acid, alcohol solutions of chloroplatinic acid, olefin complexes of platinum, and vinylsiloxane complexes of platinum; palladium based catalysts such as tetrakis(triphenylphosphine)palladium; and rhodium based catalysts. In particular, component (C) is preferably a catalyst for a platinum based hydrosilylation reaction. The amount used is a catalyst amount, can be appropriately selected in accordance with the desired curing conditions, and is generally within the range of approximately 1 to 1000 ppm with respect to the organopolysiloxane. In addition, in terms of improving the handleability as well as the pot life of the composition, a platinum containing hydrosilylation reaction catalyst in fine particles dispersed and encapsulated with thermoplastic resin may be used. Note that as a catalyst for promoting a hydrosilylation reaction, a nonplatinum based metal catalyst such as iron, ruthenium, and iron/cobalt may be used.

When component (F) is used in combination with component (E), the curability of the composition according to the present invention in warming at from room temperature to 50° C., as well as the adhesiveness to various base materials, can be improved. Specifically, component (F) is the catalyst amount of a catalyst for a condensation reaction, promoting and curing for the intention to the condensation reaction of the organopolysiloxane. Exemplary components (F) may include, for example: tin compounds such as dimethyltin dineodecanoate and stannous octoate; titanium compounds such as tetra(isopropoxy)titanium, tetra(n-butoxy)titanium, tetra(t-butoxy)titanium, di(isopropoxy)bis(ethylacetoacetate)titanium, di(isopropoxy)bis(methylacetoacetate)titanium, titaniumtetraacetylacetonate, and di(isopropoxy)bis(acetylacetonate)titanium; aluminum compounds such as aluminum trisacetylacetonate, aluminum trisacetriacetate, and tris(sec-butoxy)aluminum; nickel compounds such as nickel bisacetylacetonate; cobalt compounds such as cobalt trisacetylacetonate; zinc compounds such as zinc bisacetylacetonate; and zirconium compounds such as zirconium tetra-n-propoxide, zirconium tetra-n-butoxide, zirconium tetraacetylacetonate, zirconium tributoxymonoacetylacetonate, zirconium monobutoxyacetylacetonate, zirconium dibutoxybis(ethylacetoacetate), zirconium tetraacetylacetonate, and zirconium tributoxymono stearate. The amount used is a catalyst amount, can be appropriately selected in accordance with the desired curing conditions, and is generally within the range of 0.01 to 5 parts by mass with respect to 100 parts by mass of the total of the organopolysiloxane in the overall composition.

Curing Inhibitor

As any component to enhance the storage stability and handleability as well as improve pot life, such a composition according to the present invention can appropriately blend curing inhibitors including: acetylene based compounds such as 2-methyl-3-butyne-2-ol, 3,5-dimethyl-1-hexyne-3-ol, 2-phenyl-3-butyne-2-ol, and 1-ethynylcyclohexanol; ene-yne compounds such as 3-methyl-3-pentene-1-yne and 3,5-dimethyl-3-hexene-1-yne; 1,3,5,7-tetramethyl-1,3,5,7-tetravinylcyclotetrasiloxane, and 1,3,5,7-tetramethyl-1,3,5,7-tetrahexenylcyclototrasiloxane; triazoles such as benzotriazole; phosphine; mercaptans; and hydrazines. The content of these curing inhibitors should be appropriately selected based on the curing conditions of the present composition, and is, for example, preferably within the range of 0.001 to 5 parts by mass with respect to 100 parts by mass of the total of the organopolysiloxane having reactive functional groups.

Component (G)

The composition according to the present invention includes an adhesion promoter (G) in addition to said components (A) to (F). Component (G), independently or as only two kinds, improves the adhesiveness of the silicone rubber cured product obtained by curing the present composition; suitably, when one or two or more selected from the following four kinds of components are used in combination, they impart excellent initial adhesiveness to an uncleaned aluminum die cast and resin material; wherein, even during use under harsh environments, the adhesive durability and adhesive strength are further improved, while the reliability/durability of electric/electronic parts can be maintained for extended periods of time.

(g1) a reaction mixture between an amino group containing organoalkoxysilane and an epoxy group containing organoalkoxysilane;

(g2) an organic compound having at least two alkoxysilyl groups per one molecule, in addition to containing bonds other than a silicon-oxygen bond between these silyl groups;

(g3) an epoxy group containing silane represented by the general formula:

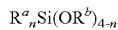

(wherein $R^a$ is a monovalent epoxy group containing organic group, $R^b$ is an alkyl group having a carbon number of 1 to 6, or a hydrogen atom, and n is a number within the range of 1 to 3)

or a partially hydrolyzed condensate thereof; and (g4) an alkoxysilane (except those having an epoxy group containing organic group), or a partially hydrolyzed condensate thereof.

Component (g1) is a reaction mixture between an amino group containing organoalkoxysilane and an epoxy group containing organoalkoxysilane. Such a component (g1) is a component for imparting initial adhesiveness to various base materials it contacts during curing, in addition to imparting adhesiveness at low temperatures particularly to an uncleaned adherend. Moreover, some curing systems of a curable composition obtained by blending this adhesion promoter may act as a crosslinking agent. Such a reaction mixture is disclosed in JP 52-8854 B and JP 10-195085 A.

Exemplary alkoxysilanes having an amino group containing organic group forming such a component (g1) may include an aminomethyltriethoxysilane, 3-aminopropyltrimethoxysilane, 3-aminopropyltriethoxysilane, 3-aminopropylmethyldimethoxysilane, N-(2-aminoethyl)aminomethyltributoxysilane, N-(2-aminoethyl)-3-aminopropyltrimethoxysilane, N-(2-aminoethyl)-3-aminopropylmethyldimethoxysilane, and 3-anilinopropyltriethoxysilane.

Moreover, exemplary epoxy groups containing organoalkoxysilanes may include 3-glycidoxyprolyltrimethoxysilane, 3-glycidoxypropylmethyldimethoxysilane, 2-(3,4-epoxy cyclohexyl)ethyltrimethoxysilane, and 2-(3,4-epoxy cyclohexyl)ethylmethyldimethoxysilane.

The ratio of the alkoxysilane having an amino group containing organic group to the alkoxysilane having an epoxy group containing organic group is, in terms of the molar ratio, preferably within the range of (1:1.5) to (1:5), particularly preferably within the range of (1:2) to (1:4). This component (g1) can be easily synthesized by mixing alkoxysilane having an amino group containing organic group and alkoxysilane having an epoxy group containing organic group as mentioned above to cause them to react at room temperature or under heating.

In particular, when an alkoxysilane having an amino group containing organic group is reacted with an alkoxysilane having an epoxy group containing organic group by the method described in JP 10-195085 A, the present invention particularly preferably contains a carbasilatrane derivative obtained by cyclizing and represented by the general formula:

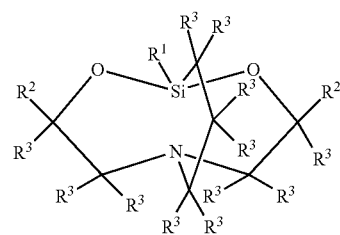

[Formula 11]

{wherein $R^1$ is an alkyl group or an alkoxy group, and $R^2$ is the same or different group selected from the group consisting of groups represented by the general formula:

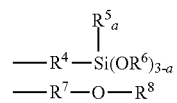

[Formula 12]

(wherein $R^4$ is an alkylene group or alkyleneoxyalkylene group, $R^5$ is a monovalent hydrocarbon group, $R^6$ is an alkyl group, $R^7$ is an alkylene group, $R^8$ is an alkyl group, alkenyl group, or acyl group, and a is 0, 1, or 2.)

$R^3$ is the same or different hydrogen atom or alkyl group.}

Exemplary carbasilatrane derivatives may include a silatrane derivative having an alkenyl group and silicon atom-bonded alkoxy group per one molecule represented by the following structure.

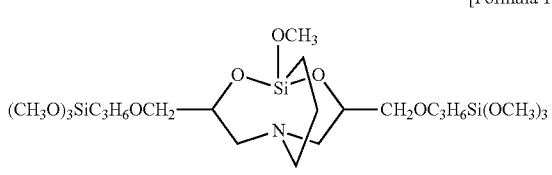

[Formula 13]

Component (g2) is an organic compound having at least two alkoxysilyl groups per one molecule, in addition to containing bonds other than a silicon-oxygen bond between these silyl groups, and can independently improve initial adhesiveness, and further, enhance adhesiveness such as by improving the adhesive durability to a cured product including this adhesion promoter under harsh conditions particularly when used in combination with one or more selected from components (g1), (g3), and (g4).

In particular, component (g2) is suitably a disilaalkane compound represented by the below mentioned general formula:

[Formula 14]

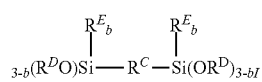

(wherein $R^C$ is a substituted or unsubstituted alkylene group having a carbon number of 2 to 20, $R^D$ is each independently an alkyl group or alkoxyalkyl group, $R^E$ is each independently a monovalent hydrocarbon group, and b is each independently 0 or 1.) Such component (g2) is commercially available as reagents or products in various compounds and can be synthesized using a well-known method such as a Grignard reaction and hydrosilylation reaction. For example, component (g2) can be synthesized via a well-known method by the hydrosilylation reaction between diene and trialkoxysilane or organodialkoxysilane.

In the formula, $R^E$ is a monovalent hydrocarbon group including: an alkyl group such as a methyl group, ethyl group, and propyl group; an alkenyl group such as a vinyl group or allyl group; and an aryl group such as a phenyl group, with a lower alkyl group preferable. $R^D$ is an alkyl group such as a methyl group, ethyl group, and propyl group, or an alkoxyalkyl group such as a methoxyethyl group, preferably having a carbon number of 4 or less. $R^C$ is a substituted or unsubstituted alkylene group, with a linear or branched alkylene group used without limitation, and may be a mixture thereof. In terms of improving adhesiveness, a linear and/or branched alkylene group having a carbon number of 2 to 20 is preferable, with a linear and/or branched alkylene having a carbon number of 5 to 10, particularly hexylene having a carbon number of 6, preferable. The unsubstituted alkylene group may be a butylene group, pentylene group, hexylene group, heptylene group, octylene group, nonylene group, decylene group, or a branched structure thereof, with the hydrogen atom capable of being substituted with a methyl group, ethyl group, propyl group, butyl group, cyclopentyl group, cyclohexyl group, vinyl group, allyl group, 3,3,3-trifluoropropyl group, or 3-chloropropyl group.

Specific examples of component (g2) may include bis(trimethoxysilyl)ethane, 1,2-bis(trimethoxysilyl)ethane, 1,2-bis(triethoxysilyl)ethane, 1,2-bis(methyldimethoxysilyl)ethane, 1,2-bis(methyldiethoxysilyl)ethane, 1,1-bis(trimethoxysilyl)ethane, 1,4-bis(trimethoxysilyl)butane, 1,4-bis(triethoxysilyl)butane, 1-methyldimethoxysilyl-4-trimethoxysilylbutane, 1-methyldiethoxysilyl-4-triethoxysilylbutane, 1,4-bis(methyldimethoxysilyl)butane, 1,4-bis(methyldiethoxysilyl)butane, 1,5-bis(trimethoxysilyl)pentane, 1,5-bis(triethoxysilyl)pentane, 1,4-bis(trimethoxysilyl)pentane, 1,4-bis(triethoxysilyl)pentane, 1-methyldimethoxysilyl-5-trimethoxysilylpentane, 1-methyldiethoxysilyl-5-triethoxysilylpentane, 1,5-bis(methyldimethoxysilyl)pentane, 1,5-bis(methyldiethoxysilyl)pentane, 1,6-bis(trimethoxysilyl)hexane, 1,6-bis(triethoxysilyl)hexane, 1,4-bis(trimethoxysilyl)hexane, 1,5-bis(trimethoxysilyl)hexane, 2,5-bis(trimethoxysilyl)hexane, 1-methyldimethoxysilyl-6-trimethoxysilylhexane, 1-phenyldiethoxysilyl-6-triethoxysilylhexane, 1,6-bis(methyldimethoxysilyl)hexane, 1,7-bis(trimethoxysilyl)heptane, 2,5-bis(trimethoxysilyl)heptane, 2,6-bis(trimethoxysilyl)heptane, 1,8-bis(trimethoxysilyl)octane, 2,5-bis(trimethoxysilyl)octane, 2,7-bis(trimethoxysilyl)octane, 1,9-bis(trimethoxysilyl)nonane, 2,7-bis(trimethoxysilyl)nonane, 1,10-bis(trimethoxysilyl)decane, and 3,8-bis(trimethoxysilyl)decane. These can be used independently or as a mixture of two or more types thereof. In the present invention, 1,6-bis(trimethoxysilyl)hexane, 1,6-bis(triethoxysilyl)hexane, 1,4-bis(trimethoxysilyl)hexane, 1,5-bis(trimethoxysilyl)hexane, 2,5-bis(trimethoxysilyl)hexane, 1-methyldimethoxysilyl-6-trimethoxysilylhexane, 1-phenyldiethoxysilyl-6-triethoxysilylhexane, and 1,6-bis(methyldimethoxysilyl)hexane can be suitably exemplified.

Component (g3) is an epoxy group containing silane represented by the general formula:

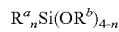

(wherein $R^a$ is a monovalent epoxy group containing organic group, $R^b$ is an alkyl group having a carbon number of 1 to 6, or a hydrogen atom, and n is a number within the range of 1 to 3)

or a partially hydrolyzed condensate thereof, independently improves initial adhesiveness, and enhances the adhesive durability under harsh conditions such as salt water immersion in a cured product including this adhesion promoter in combination with said components (g1) and (g2). Note that component (g3) is one of the constituent components of component (g1), (wherein the mass ratio with reactant component (g1) (typically, a carbasilatrane derivative serving as a cyclized reactant) within the specific range is suitable in terms of the technical effects of the invention) and may be preferably added as a component separate from component (g1).

Exemplary epoxy group containing silanes may include 3-glycidoxyprolyltrimethoxysilane, 3-glycidoxypropylmethyldimethoxysilane, 2-(3,4-epoxy cyclohexyl)ethyltrimethoxysilane, and 2-(3,4-epoxy cyclohexyl)ethylmethyldimethoxysilane.

(g4) Alkoxysilane (except those having an epoxy group containing organic group) or a partially hydrolyzed condensate thereof is any adhesion promoter not corresponding to the abovementioned component (g3), functions as an auxiliary crosslinking agent component, and also improves the adhesiveness of the cured product due to chemical interaction with the surface of metal or resin base materials. Specific examples of such component (g4) include: trifunctional alkoxysilanes such as methyltrimethoxysilane, methyltriethoxysilane, ethyltrimethoxylane, ethyltriethoxysilane, vinyltrimethoxysilane, and phenyltrimethoxysilane; tetrafunctional alkoxysilanes such as tetramethoxysilane and tetraethoxysilane; and alkoxysilanes having methacryl group containing organic groups or acryl group containing organic groups, such as 3-methacryloxypropyltrimethoxysilane, 3-methacryloxypropyltriethoxysilane, 3-methacryloxypropylmethyldimethoxysilane, 3-acryloxypropyltrimethoxysilane, and 3-acryloxypropylmethyldimethoxysilane, as well as partially hydrolyzed condensates thereof, with a trifunctional alkoxysilane having an ethyl group and partially hydrolyzed condensates thereof, as well as partially hydrolyzed condensates of a tetrafunctional alkoxysilane, particularly preferable. These partially hydrolyzed condensates have T units or Q units in molecules, and accordingly, may improve adhesiveness and base material adherence, in addition to further improving the coating film strength of the cured product. Moreover, by blending an alkoxysilane having a methacryl group containing organic group or acryl group containing organic group, adhesiveness and base material adherence may be able to be more effectively improved.

The adhesion promoter (G) may be obtained by mixing said components (g1) to (g4) at a specific mass ratio.

Component (H)

The curable organopolysiloxane composition according to the present invention preferably further contains an inorganic filler (H). This inorganic filler is preferably one or more selected from a reinforcing filler, a thermally conductive filler, and a conductive filler, preferably containing a reinforcing filler particularly when the present invention composition is used in the application of a protectant or adhesive.

The reinforcing filler is a component which imparts mechanical strength to a silicone rubber cured product obtained by curing the present composition and improving the performance as a protectant or adhesive. Exemplary reinforcing fillers may include, for example, inorganic fillers such as fumed silica fine powder, precipitated silica fine powder, burned silica fine powder, fumed titanium dioxide fine powder, quartz fine powder, calcium carbonate fine powder, diatomaceous earth fine powder, aluminum oxide fine powder, aluminum hydroxide fine powder, zinc oxide fine powder, and zinc carbonate fine powder, with these inorganic fillers capable of containing inorganic fillers surface treated with treatment agents including organoalkoxysilanes such as a methyltrimethoxysilane, organohalosilanes such as a trimethylchlorosilane, organosilazanes such as a hexamethyldisilazane, and siloxane oligomers such as a dimethylsiloxane oligomer blocked by an $\alpha,\omega$-silanol group, a methylphenylsiloxane oligomer blocked by an $\alpha,\omega$-silanol group, and a methylvinylsiloxane oligomer blocked by an $\alpha,\omega$-silanol group. In particular, by treating the surface of component (H) in advance with an organopolysiloxane of a low degree of polymerization having a silanol group at both terminals of a molecular chain (suitably, a dimethylpolysiloxane blocked by an $\alpha,\omega$-silanol group not having reactive functional groups other than this terminal silanol group in molecules), excellent initial adhesiveness, adhesive durability, and adhesive strength at room temperature can be achieved, with further sufficient usable time (storage period, handling operation time, and pot life) capable of being ensured.

While not particularly limited thereto, the particle diameter of fine powder of the reinforcing filler may be, for example, within the range of 0.01 μm to 1000 μm at the median diameter based on the laser diffraction/scattering type particle size distribution measurement.

While not limited thereto, the content of the reinforcing filler is preferably within the range of 0.1 to 200 parts by mass with respect to 100 parts by mass of the organopolysiloxane.

The thermally conductive filler or the conductive filler is a component which imparts thermal conductivity or electric conductivity to the silicone rubber cured product obtained by curing the present composition as desired, with examples thereof including: metal fine powder such as gold, silver, nickel, and copper; fine powder obtained by depositing or plating metals such as gold, silver, nickel, or copper on the surface of fine powder such as ceramics, glass, quartz, or organic resin; a metal compound such as aluminum oxide, aluminum nitride, or zinc oxide, as well as mixtures of two or more thereof. Silver powder, aluminum powder, aluminum oxide powder, zinc oxide powder, aluminum nitride powder, or graphite is particularly suitable. Moreover, if electric insulation is required in the present composition, metal oxide based powder or metal nitride based powder is preferable, with aluminum oxide powder, zinc oxide powder, or aluminum nitride powder particularly preferable. Moreover, these thermally conductive fillers or conductive fillers are preferably heated and mixed with component (B), etc. under reduced pressure at a temperature of 100 to 200° C. In particular, component (B) is a siloxane having an alkoxysilyl containing group, and may obtain a composition having excellent handleability at a low viscosity even when highly filled by the surface treatment of the thermally conductive filler or conductive filler.

The average particle diameter of such a thermally conductive filler or conductive filler, as the median diameter, is preferably within the range of 1 to 100 μm, particularly preferably within the range of 1 to 50 μm.

Moreover, the present composition may optionally contain: organic solvents such as toluene, xylene, acetone, methylethyl ketone, methylisobutyl ketone, hexane, and heptane; noncrosslinkable diorganopolysiloxanes such as a dimethylpolysiloxane blocked by an $\alpha,\omega$-trimethylsiloxy group and a methylphenylpolysiloxane blocked by an $\alpha,\omega$-trimethylsiloxy group; flame retardants such as carbon black; antioxidants such as a hindered phenol based antioxidant; heat resistant agents such as iron oxide; plasticizers such as a dialkylsiloxane oligomer blocked by a hydroxydialkylsiloxy group at both terminals of a molecular chain; and other pigments, thixotropy imparting agents, and antifungal agents, as long as the present composition does not impair the object of the present invention.

The curable organopolysiloxane composition according to the present invention can be produced by uniformly mixing the organopolysiloxanes, two different curing catalysts, an adhesion promoter, and any other component. Although the method for mixing each component of the organopolysiloxane composition may be a conventionally known method and is not particularly limited, a uniform mixture is generally made by simple stirring. Moreover, if a solid component such as an inorganic filler is contained as any component, mixing using a mixing apparatus is more preferable. While not particularly limited thereto, exemplary such mixing apparatuses may include a single or twin shaft continuous mixer, two rolls, Ross mixer, Hobart mixer, dental mixer, planetary mixer, kneader mixer, Henschel mixer, etc.

The curable organopolysiloxane composition according to the present invention can be used as a one-liquid curable organopolysiloxane composition; however, because it uniformly cures both the surface layer and the inside regardless of the moisture and water content in the atmosphere, it is desirably a multi-component type, particularly suitably a two-liquid type curable organopolysiloxane composition.

More specifically, the present composition can be produced by uniformly mixing components (A) to (G), and if necessary, component (H) and other arbitrary components under moisture blocking.

In the case of the two-liquid type curable organopolysiloxane composition, a one-liquid component contains at least said components (E) and (F), and optionally contains part of component (A), while a two-liquid component contains at least components (B), (C), (D), and (G), as well as the remaining amount of component (A).

Both the one-liquid component and the two-liquid component can be encapsulated in a sealed container under moisture blocking so as to be capable of being stored for extended periods of time, wherein the one-liquid component and the two-liquid component can be mixed and then rapidly cured under warming at room temperature or 50° C. or lower to form a silicone rubber.

The curable organopolysiloxane composition according to the present invention is favorably adhered to various adherends or base bodies. Exemplary adherends or base bodies may include adherends or base bodies made of glass, ceramics, mortar, concrete, wood, aluminum, copper, brass, zinc, silver, a stainless steel, iron, galvanized iron, tin plate, nickel plating surface, epoxy resin, phenol resin, etc. Moreover, examples thereof may also include adherends or base bodies made of thermoplastic resins such as polycarbonate resin, polyester resin, ABS resin, nylon resin, polyvinyl chloride resin, polyphenylene sulfide resin, polyphenylene ether resin, or polybutylene terephthalate resin. Moreover, if firmer adhesiveness is required, the abovementioned adhesion promoter may be blended, and in addition, an appropriate primer may be applied to the surfaces of these adherends or base bodies, with the curable organopolysiloxane composition according to the present invention capable of being adhered to the primer application surface.

A multi-component type curable silicone rubber composition according to the present invention is suitable as a building member and as a sealing material, potting material, sealing material, or adhesive of electric/electronic parts and vehicle parts. Specifically, it can be suitably used as a sealing agent for adhering glass, a sealing material of a bathtub unit, an adhesive and sealing material for illumination parts of a vehicle such as an automobile, a protectant or adhesive of electric/electronic parts (a sealing material, coating material, potting agent, or adhesive), etc.

The curable organopolysiloxane composition according to the present invention has an excellent effect of improving initial adhesiveness to various base materials it contacts during curing, particularly to an organic resin such as an uncleaned aluminum die cast, polybutylene terephthalate (PBT) resin, and polyphenylene sulfide (PPS) resin, has particularly excellent adhesive durability and can achieve high adhesive strength after curing, and accordingly is particularly useful as a protectant or adhesive composition of electric/electronic parts.

Use As a Thin Layer Adhesive and Thin Layer Protectant

The curable organopolysiloxane composition according to the present invention enables the provision of a cured product including electric/electronic equipment. In particular, due to the abovementioned configuration, characteristically, the present composition, even in small amounts and a thin layer, is firmly initially adhered to an adherend, in addition to being able to achieve high adhesive strength. Therefore, an adhesive layer including the curable organopolysiloxane composition according to the present invention has a firm bond to the adherend and forms an adhesive/adhesion state (a cohesive failure mode upon forcibly tearing off) which is difficult to tear off by interfacial peeling, etc. Specifically, when a cured layer has a thickness of 10 to 500 µm, the curable organopolysiloxane composition according to the present invention can adhere or protect various base materials and is useful as an adhesive or protectant used in an adhesive form different from conventional ones in adhesion in small amounts, adhesion in a thin layer, in complicated shapes, etc. In particular, it is suitably utilized for electric/electronic equipment including an adhesive layer or protective layer, wherein the cured layer has a thickness of 10 to 500 µm, suitably 50 to 300 µm. Moreover, because the curable organopolysiloxane composition according to the present invention exerts high initial adhesiveness and adhesive strength to the adherend in adhesive forms other than thin layer adhesion, it is also useful as a conventionally used thick coating, potting agent, encapsulant, or sealant, and enables the provision of electric/electronic equipment including an adhesive layer or protective layer.

The electric/electronic parts according to the present invention are not particularly limited unless they are encapsulated or sealed by the composition, with examples thereof including electronic equipment including an electric circuit or electrode, etc. wherein a metal electrode (such as silver, copper, aluminum, or gold) and a metal oxide film electrode (such as ITO (Indium Tin Oxide)) are formed on base materials of glass, epoxy resin, polyimide resin, phenol resin, ceramics, etc. Because the protectant or adhesive composition including the curable organopolysiloxane composition according to the present invention has an excellent effect of improving initial adhesiveness, in addition to being able to achieve particularly excellent adhesive durability and high adhesive strength after curing, it can improve the reliability and durability of these electric/electronic parts if used as an adhesive, potting material, coating material, or sealing material, etc. to protect or adhere electric/electronic parts. In particular, it can be suitably used to form the waterproof structure of an electronic circuit board, etc.

More specifically, the protectant or adhesive composition of electric/electronic parts according to the present invention is useful as a sealing material of a structure made of metal and/or resin requiring durability, water resistance, etc., such as peripheral parts, onboard parts cases, terminal boxes, illumination parts, and solar cell modules of electric/electronic equipment, and has excellent initial adhesiveness and adhesive durability, for example, when applied to a circuit board and housing case thereof in the application of power semiconductors such as engine controls (in a transport machine), power/train systems, and air conditioner controls. Further, advantageously, when it is also incorporated into onboard electronic parts such as an electronic control unit (ECU) and used under harsh environments, excellent adhesive durability is achieved, while the reliability and durability of these power semiconductors, onboard parts, etc., as well as water resistance to rainwater, etc., can be improved. While not particularly limited thereto, in the use method, for example, a shape such as in an elastic sealing material in the waterproof structure of the onboard engine control circuit described in JP 2007-235013 A may be used. Similarly, a sealing material may be used for the purpose of waterproofing in an automobile harness with a terminal described in JP 2009-135105 A, or may be used in a water stop agent made of silicone resin in a water stop method of an electric wire and a water stop structure of an electric wire described in JP 2012-204016. Further, as described in JP 2002-170978 A, etc., a sealing resin in a method for connecting a solar cell module, terminal box, and solar cell module may be used.

EXAMPLES

Hereinafter, while not limited thereto, the present invention will be described with reference to examples. Moreover, the adhesiveness of the curable organopolysiloxane composition was evaluated by the following method.

Preparation Method of the Curable Organopolysiloxane, Along with the Evaluation Method of Adhesiveness The silicone adhesive composition indicated in the below mentioned Tables 1 and 2 was produced. Specifically, the below mentioned components (A-1), (A-2), (H-1), and (H-2) were mixed in advance, then subsequently, components (E) and (F) were added to the mixture, sufficiently stirred, and subjected to a defoaming process to prepare the one-liquid component. Moreover, the below mentioned (A-1), (A-2), (J-1), (J-2), (H-1), and (H-2) were mixed in advance, then subsequently, components (B), (C), (D), (G-1), (G-2), and (I) were added to the mixture, sufficiently stirred, and subjected to a defoaming process to prepare the two-liquid component. Each of the thus obtained liquids were filled into a plastic double cartridge produced by MIX-PAC and installed on the tip of a static nozzle (21 stages) cartridge. Further, using a cartridge gun, the two liquids were ejected onto the adherend while being mixed to produce an adhesive test piece.

As the adherend, two uncleaned aluminum die cast (ADC12) plates and two polybutylene terephthalate (PBT) resin plates were prepared, the below mentioned curable organopolysiloxane composition was interposed between base materials using a spacer produced by Teflon (registered trademark) so as to give a thickness of 1 mm or 80 μm, then left to stand under the conditions of a temperature of 25±2° C. and a humidity of 50±5% to cure a room temperature curable silicone rubber composition (form an adhesive layer). Here, an adhesion test piece including an adhesive layer having a thickness of 80 μm was used/evaluated as a thin layer adhesive layer, while an adhesion test piece including an adhesive layer having a thickness of 1 mm was used/evaluated as a thick film adhesive layer.

Evaluation of the Adhesive Strength (MPa) and Failure Mode

The tensile shear adhesive strength of the obtained adhesion test pieces was measured in accordance with the method specified in JIS K 6850:1999 "Adhesives-Determination of tensile lap-shear strength of rigid-to-rigid bonded assemblies" after 8 hours and 24 hours, respectively, and recorded as the adhesive strength in Tables 1 to 3. The tensile speed was 50 mm/min. Note that all the units of adhesive strength in Tables 1 to 3 are MPa.

Moreover, the failure state of the adhesive after fracture was confirmed. The failure state of the adhesive is divided into three kinds (the failure mode of the adhesive layer): a cohesive failure; thin layer cohesive failure; and interfacial peeling. In the case of an ideal adhesive state, the failure mode is a cohesive failure. Here, "CF," "tCF," and "AF" in the below mentioned Tables 1 and 2 represent the failure modes of "cohesive failure," "thin layer cohesive failure," and "interfacial peeling," respectively.

"ADC12" in the below mentioned Tables 1, 2, and 3 is the result obtained by using an uncleaned aluminum die cast plate as the adherend, while "PBT" is the result obtained by using a polybutylene terephthalate (PBT) resin plate as the adherend. Further, Si—H/Si-Vi in the tables represents the ratio of the number of moles of vinyl groups to the number of moles of silicon atom-bonded hydrogen atoms in the composition.

In Tables 1 and 2, each component (only the Pt complex is written as the mass ppm) used is as follows. Note that the viscosity is a value measured by a rotary viscometer at 25° C.

(A-1) Vi siloxane at both terminals:
dimethylpolysiloxane blocked by a dimethylvinylsiloxy group at both terminals of a molecular chain (viscosity: 2,000 mPa/s, Vi content: 0.23 mass %)

(A-2) Vi siloxane resin:
Siloxane resin represented by $(CH_2=CH(CH_3)_2SiO_{0.5})_4((CH_3)_3SiO_{0.5})_{40}(SiO_{2.0})_{56}$ and having Vi content of 2.0 mass % and a weight average molecular weight of 20,000

(B) SiH siloxane: SiH and trialcoxysilyl group containing siloxane represented by the following formula (viscosity: 1.6 mPa/s, SiH content: 0.35 mass %)

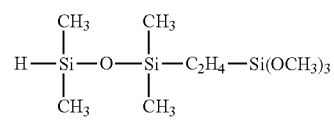

[Formula 15]

(C-1) SiH siloxane: 1,1,5,5-tetramethyl-3,3-diphenyltrisiloxane represented by the following formula (viscosity: 4 mPa/s, SiH content: 0.60 mass %)

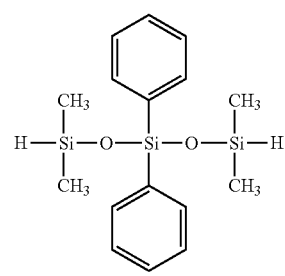

[Formula 16]

(C-2) SiH siloxane:
dimethylsiloxane blocked by a dimethylhydrogen siloxy group at both terminals of a molecular chain (viscosity: 5 mPa/s, SiH content: 0.12 mass %)

(C-3) SiH siloxane: cyclic dimethylhydrogen siloxane represented by the following formula (viscosity: 10 mPa/s, SiH content: 0.40 mass %)

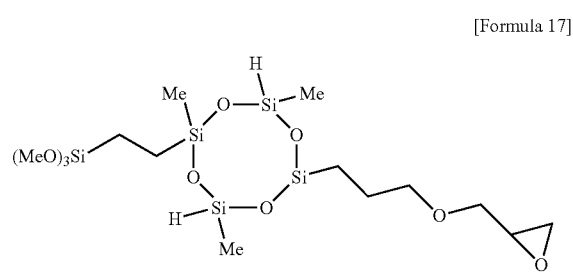

[Formula 17]

(D-1)
Methylhydrogen siloxane/dimethylsiloxane copolymer blocked by a trimethylsiloxy group at both terminals of a molecular chain (viscosity: 5 mPa/s, SiH content: 0.72 mass %)

(D-2)
Methylhydrogen siloxane blocked by a trimethylsiloxy group at both terminals of a molecular chain (viscosity: 20 mPa/s, SiH content: 1.59 mass %)

(D-3)
Branched organohydrogen siloxane represented by $((CH)_2HSiO_{0.5})_{60}((C_6H_5)SiO_{1.5})_{40}$ (viscosity: 20 mPa/s SiH content rate: 0.65 mass %)

(E) Pt complex: 1,3-divinyl-1,1,3,3-tetramethyldisiloxane complex of platinum (the mass unit of platinum metal with respect to the total of the organopolysiloxane component in the present composition has an amount within the range of each ppm indicated in Tables 1 and 2)

(F) Ti condensation catalyst: di(isopropoxy)bis(ethylacetoacetate)titanium

Each Component of the Adhesion Promoter (G-1) HMSH: 1,6-bis(trimethoxysilyl)hexane
(G-2) Ep silane: 3-glycidoxyprolyltrimethoxysilane
(H-1) Fumed silica: fumed silica surface treated with hexamethyldisilazane (surface area: 130 m²/g)
(H-2) Ground silica powder: silica powder having an average particle diameter (d50) of 1.7 μm
(I) Curing control agent: PBO: 2-phenyl-3-butyne-2-ol
Component (J): organopolysiloxane having an alkoxysilyl containing group represented by the following formula]

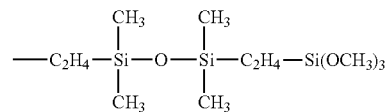

[Formula 18]

(J-1) Polysiloxane modified at both terminals: dimethylpolysiloxane having an alkoxysilyl containing group at both terminals of a molecular chain (viscosity: 2,000 mPa/s)

(J-2) (Vi) siloxane modified on one terminal: dimethylsiloxane, wherein only one terminal of a molecular chain has an alkoxysilyl containing group, while the other terminal thereof is blocked by a dimethylvinylsiloxy group (viscosity: 2,000 mPa/s, Vi content of 0.12 mass %)

As mentioned above, components (J-1) and (J-2) are mixtures obtained by subjecting the below mentioned alkoxysilyl containing siloxane to the hydrosilylation reaction with a dimethylsiloxane (viscosity: 2,000 mPa/s) blocked by a dimethylvinylsiloxy group at both terminals of a molecular chain, in the presence of a catalyst for a hydrosilylation reaction, so as to give 0.8 mole equivalent per vinyl group, with parts by mass in the comparative examples in Table 2 serving as theoretical values.

TABLE 1

| Component/blending amount (parts by mass) | | Example | | | | | | | |
|---|---|---|---|---|---|---|---|---|---|
| | | 1 | 2 | 3 | 4 | 5 | 6 | 7 | 8 |
| | A-1 | 87 | 87 | 87 | 87 | 87 | 87 | 87 | 87 |
| | A-2 | 13 | 13 | 13 | 13 | 13 | 13 | 13 | 13 |
| | J-1 | 0 | 0 | 0 | 0 | 0 | 0 | 0 | 0 |
| | J-2 | 0 | 0 | 0 | 0 | 0 | 0 | 0 | 0 |
| | B | 0.4 | 1.7 | 4.0 | 6.5 | 0.4 | 0.4 | 0.4 | 0.4 |
| | C-1 | 0 | 0 | 0 | 0 | 0 | 0 | 2.0 | 0 |
| | C-2 | 9.2 | 6.0 | 7.1 | 7.2 | 4.6 | 10.2 | 0 | 0 |
| | C-3 | 0 | 0 | 0 | 0 | 0 | 0 | 0 | 2.9 |
| | D-1 | 1.1 | 1.1 | 1.1 | 1.1 | 1.5 | 0 | 1.1 | 1.1 |
| | D-2 | 0 | 0 | 0 | 0 | 0 | 0.5 | 0 | 0 |
| | D-3 | 0 | 0 | 0 | 0 | 0 | 0 | 0 | 0 |
| | E (unit: ppm) | 18 | 18 | 18 | 18 | 18 | 18 | 18 | 18 |
| | F | 0.3 | 0.3 | 0.3 | 0.3 | 0.3 | 0.3 | 0.3 | 0.3 |
| | G-1 | 1.75 | 1.75 | 1.75 | 1.75 | 1.75 | 1.75 | 1.75 | 1.75 |
| | G-2 | 1.75 | 1.75 | 1.75 | 1.75 | 1.75 | 1.75 | 1.75 | 1.75 |
| | H-1 | 13 | 13 | 13 | 13 | 13 | 13 | 13 | 13 |
| | H-2 | 25 | 25 | 25 | 25 | 25 | 25 | 25 | 25 |
| | I | 0.013 | 0.013 | 0.013 | 0.013 | 0.013 | 0.013 | 0.013 | 0.013 |
| | Si—H/Si-Vi | 1.2 | 1.2 | 1.8 | 2.3 | 1.0 | 1.3 | 1.3 | 1.2 |
| Adhesiveness to ADC12 having an adhesive thickness of 80 μm | | | | | | | | | |
| after 8 hours | Adhesive strength (MPa) | 0.8 | 1.9 | 1.0 | 0.4 | 0.6 | 0.9 | 1.3 | 0.8 |
| | Failure mode | tCF | CF | tCF | tCF | tCF | CF | CF | CF |
| after 24 hours | Adhesive strength (MPa) | 1.9 | 2.1 | 1.5 | 1.0 | 1.8 | 2.3 | 2.4 | 1.7 |
| | Failure mode | CF | CF | CF | CF | CF | CF | CF | CF |
| Adhesiveness to PBT having an adhesive thickness of 80 μm | | | | | | | | | |
| after 8 hours | Adhesive strength (MPa) | 1.1 | 1.2 | 1.5 | 0.7 | 1.0 | 1.7 | 0.8 | 1.6 |
| | Failure mode | tCF | CF | tCF | tCF | CF | CF | CF | CF |
| after 24 hours | Adhesive strength (MPa) | 2.5 | 1.9 | 1.6 | 1.2 | 2.1 | 2.9 | 2.4 | 2.5 |
| | Failure mode | CF | CF | CF | CF | CF | CF | CF | CF |
| Adhesiveness to ADC12 having an adhesive thickness of 1 mm | | | | | | | | | |
| after 8 hours | Adhesive strength (MPa) | 0.9 | 0.8 | 0.6 | 0.4 | 0.7 | 0.6 | 0.7 | 0.6 |
| | Failure mode | CF | CF | CF | CF | CF | CF | CF | CF |

TABLE 1-continued

| Component/blending amount | | Example | | | | | | | |
|---|---|---|---|---|---|---|---|---|---|
| (parts by mass) | | 1 | 2 | 3 | 4 | 5 | 6 | 7 | 8 |
| after 24 hours | Adhesive strength (MPa) | 1.9 | 1.6 | 1.4 | 1.1 | 1.8 | 1.7 | 1.6 | 1.6 |
| | Failure mode | CF | CF | CF | CF | CF | CF | CF | CF |
| Adhesiveness to PBT having an adhesive thickness of 1 mm | | | | | | | | | |
| after 8 hours | Adhesive strength (MPa) | 1.2 | 1.0 | 0.8 | 0.5 | 0.9 | 1.1 | 0.6 | 1.2 |
| | Failure mode | CF | CF | CF | CF | CF | CF | CF | CF |
| after 24 hours | Adhesive strength (MPa) | 1.7 | 1.7 | 1.5 | 1.2 | 1.7 | 1.9 | 1.8 | 1.7 |
| | Failure mode | CF | CF | CF | CF | CF | CF | CF | CF |

TABLE 2

| Component/blending amount | | Comparative Example | | | | | |
|---|---|---|---|---|---|---|---|
| (parts by mass) | | 1 | 2 | 3 | 4 | 5 | 6 |
| | A-1 | 87 | 65 | 65 | 87 | 87 | 87 |
| | A-2 | 13 | 13 | 13 | 13 | 13 | 13 |
| | J-1 | 0 | 14.5 | 14.5 | 0 | 0 | 0 |
| | J-2 | 0 | 7.5 | 7.5 | 0 | 0 | 0 |
| | B | 0 | 0 | 0 | 0.4 | 0.4 | 0.4 |
| | C-1 | 0 | 0 | 2.0 | 0 | 0 | 2.0 |
| | C-2 | 10.3 | 9.2 | 0 | 0 | 9.2 | 0 |
| | C-3 | 0 | 0 | 0 | 0 | 0 | 0 |
| | D-1 | 1.1 | 1.1 | 1.1 | 2.9 | 0 | 0 |
| | D-2 | 0 | 0 | 0 | 0 | 0 | 0 |
| | D-3 | 0 | 0 | 0 | 0 | 1.4 | 1.4 |
| | E (unit: ppm) | 18 | 18 | 18 | 18 | 18 | 18 |
| | F | 0.3 | 0.3 | 0.3 | 0.3 | 0.3 | 0.3 |
| | G-1 | 1.75 | 1.75 | 1.75 | 1.75 | 1.75 | 1.75 |
| | G-2 | 1.75 | 1.75 | 1.75 | 1.75 | 1.75 | 1.75 |
| | H-1 | 13 | 13 | 13 | 13 | 13 | 13 |
| | H-2 | 25 | 25 | 25 | 25 | 25 | 25 |
| | I | 0.013 | 0.013 | 0.013 | 0.013 | 0.013 | 0.013 |
| | Si—H/Si-Vi | 1.2 | 1.2 | 1.3 | 1.3 | 1.3 | 1.3 |
| Adhesiveness to ADC12 having an adhesive thickness of 80 μm | | | | | | | |
| after 8 hours | Adhesive strength (MPa) | 0.8 | 0.6 | 0.4 | 0.7 | 1.3 | 1.1 |
| | Failure mode | AF | AF | AF | AF | tCF | tCF |
| after 24 hours | Adhesive strength (MPa) | 1.1 | 1.5 | 1.9 | 1.4 | 2.8 | 2.6 |
| | Failure mode | AF | AF | AF | AF | CF | CF |
| Adhesiveness to PBT having an adhesive thickness of 80 μm | | | | | | | |
| after 8 hours | Adhesive strength (MPa) | 1.0 | 0.5 | 0.6 | 0.7 | 0.6 | 0.5 |
| | Failure mode | AF | AF | AF | AF | AF | AF |
| after 24 hours | Adhesive strength (MPa) | 1.2 | 1.3 | 2.1 | 1.6 | 1.3 | 1.0 |
| | Failure mode | AF | AF | tCF | AF | AF | AF |
| Adhesiveness to ADC12 having an adhesive thickness of 1 mm | | | | | | | |
| after 8 hours | Adhesive strength (MPa) | 0.6 | 0.6 | 0.8 | 0.6 | 1.2 | 1.0 |
| | Failure mode | AF | CF | CF | AF | CF | CF |
| after 24 hours | Adhesive strength (MPa) | 1.0 | 1.5 | 1.6 | 1.1 | 2.1 | 2.3 |
| | Failure mode | AF | CF | CF | CF | CF | CF |
| Adhesiveness to PBT having an adhesive thickness of 1 mm | | | | | | | |
| after 8 hours | Adhesive strength (MPa) | 0.8 | 0.9 | 0.7 | 0.5 | 0.3 | 0.5 |
| | Failure mode | AF | CF | CF | AF | AF | AF |
| after 24 hours | Adhesive strength (MPa) | 1.1 | 1.6 | 1.6 | 0.9 | 1.1 | 0.9 |
| | Failure mode | CF | CF | CF | CF | AF | AF |

Comparative Examples 1 and 4 do not include component (B) and component (C), respectively, wherein an adhesive layer had insufficient adhesive strength at thicknesses of both 80 μm and 1 mm, with interfacial peeling (AF) observed. Moreover, in Comparative Examples 2 and 3, instead of not using component (B), part of component (A-1) was replaced with (J-1) and component (J-2); wherein, when the failure mode of the adhesive layer was evaluated and the adhesive layer had a thickness of 80 μm, adhesiveness was insufficient, with thin layer cohesive failure (tCF) or interfacial peeling (AF) observed. Further, in Comparative Examples 5 and 6 in which a branched organohydrogen siloxane was used as component (D), while the adhesion to an aluminum die cast was good, interfacial peeling from PBT was observed, with insufficient adhesive strength.

In contrast, as indicated in Examples 1 to 8, in a curable organopolysiloxane composition (including: an alkoxysilyl containing siloxane serving as component (B) having one silicon atom-bonded hydrogen atom and at least one trialcoxysilyl group per one molecule; and an organopolysiloxane serving as component (C) having two silicon atombonded hydrogen atoms per one molecule), the failure mode of the adhesive layer at all thicknesses was cohesive failure (CF), interfacial peeling was not observed, and firm and good adhesive strength to an adherend was achieved in all cases.

Using the composition of Example 7, a test piece for measuring the tensile shear adhesive strength so as to have an adhesive layer of 80 μm was created by the abovementioned method. Under the curing conditions of a temperature of 25±2° C. and humidity of 50±5% for 24 hours, the tensile shear adhesive strength of this adhesion test piece was measured to give the initial value. Further, this test piece was left to stand under environments of 85/85% RH (relative humidity) and 150° C., respectively, for 500 hours, after which the tensile shear adhesive strength was similarly measured as mentioned above and recorded as the adhesive strength in Table 3. Under all conditions, firm and good adhesiveness to the adherend was exhibited.

TABLE 3

| ADC12 | Initial | Adhesive strength (MPa) | 2.4 |
|---|---|---|---|
|  |  | Failure mode | CF |
|  | 150° C. | Adhesive strength (MPa) | 3.1 |
|  | after 500 hours | Failure mode | CF |
|  | 85° C./85% RH | Adhesive strength (MPa) | 3.0 |
|  | after 500 hours | Failure mode | CF |
| PBT | Initial | Adhesive strength (MPa) | 2.4 |
|  |  | Failure mode | CF |
|  | 150° C. | Adhesive strength (MPa) | 2.6 |
|  | after 500 hours | Failure mode | CF |
|  | 85° C./85% RH | Adhesive strength (MPa) | 3.3 |
|  | after 500 hours | Failure mode | CF |

INDUSTRIAL APPLICABILITY

The curable organopolysiloxane composition according to the present invention is cured by heating to form a low-hardness silicone rubber or a high-hardness silicone rubber, exhibits excellent initial adhesiveness to various uncleaned base materials it contacts during curing, exhibits excellent adhesive strength and adhesive durability for extended periods of time even during use in harsh environments, and can be favorably adhered to an uncleaned aluminum die cast and resin material, etc. as desired by curing at a room temperature of 25° C., enabling it to be utilized as a protectant or adhesive composition of electric/electronic parts, particularly an adhesive and sealing agent of an onboard electric/electronic apparatus. Moreover, the curable organopolysiloxane composition and the protectant or adhesive composition of electric/electronic parts according to the present invention are also useful as a protective material of power devices such as motor control, motor control for a transport machine, a power generation system, or a space transport system, for which demand has recently increased, and is used in harsh environments, in addition to being useful as a protective material or adhesive of general purpose inverter controls such as the engine controls in transport machines, power/train systems, and air conditioner controls, onboard electronic parts such as electronic control units (ECU), motor controls such as servomotor controls and machine tools/elevators, motor controls for transport machines such as electric automobiles, hybrid cars, or railroads, a system for power generators such as sunlight/wind power/fuel cell power generation, space transport systems used in outer space, etc.

The invention claimed is:

1. A curable organopolysiloxane composition comprising:
(A) 100 parts by mass of an organopolysiloxane having at least two alkenyl groups per one molecule;
(B) 0.05 to 10 parts by mass of a trialkoxysilyl containing siloxane represented by the following formula:

[Formula 1]

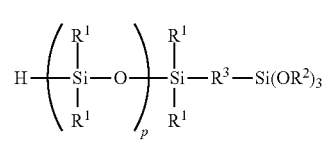

wherein $R^1$ is the same or different alkyl group, $R^2$ is an alkyl group, $R^3$ is an alkylene group having a carbon number of 2 to 10, and p is an integer of 1 to 5;
(C) 0.1 to 30 parts by mass of a chain or cyclic organopolysiloxane having at least two silicon atom-bonded hydrogen atoms per one molecule;
(D) 0.1 to 10 parts by mass of a chain organopolysiloxane having at least three silicon atom-bonded hydrogen atoms per one molecule;
(E) a catalyst amount of a catalyst for a hydrosilylation reaction;
(F) a catalyst amount of a catalyst for a condensation reaction; and
(G) an adhesion promoter;
wherein the total amount of the silicon atom-bonded hydrogen atoms of components (B), (C), and (D) with respect to the number of the alkenyl groups in all the components is 0.3 to 10.

2. The curable organopolysiloxane composition according to claim 1, wherein component (B) is a trialkoxysilyl containing siloxane represented by the following formula:

[Formula 2]

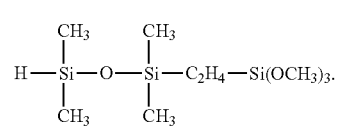

3. The curable organopolysiloxane composition according to claim 1, wherein the composition comprises less than 5.0 mass % of an organopolysiloxane having an alkoxysilyl containing group represented by the general formula:

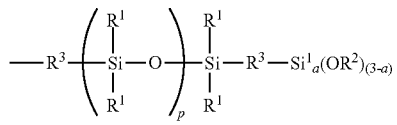 [Formula 3]

wherein $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50.

4. The curable organopolysiloxane composition according to claim 1, wherein the adhesion promoter (G) is one or two or more selected from the following components (g1) to (g4):
  (g1) a reaction mixture between an amino group containing organoalkoxysilane and an epoxy group containing organoalkoxysilane;
  (g2) an organic compound having at least two alkoxysilyl groups per one molecule, in addition to containing bonds other than a silicon-oxygen bond between these silyl groups;
  (g3) an epoxy group containing silane represented by the general formula:

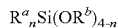

wherein $R^a$ is a monovalent epoxy group containing organic group, $R^b$ is an alkyl group having a carbon number of 1 to 6, or a hydrogen atom, and n is a number within the range of 1 to 3 or a partially hydrolyzed condensate thereof; and
  (g4) an alkoxysilane except those having an epoxy group containing organic group, or a partially hydrolyzed condensate thereof.

5. The curable organopolysiloxane composition according to claim 1, further comprising (H) an inorganic filler.

6. The curable organopolysiloxane composition according to claim 1, which is room temperature curable.

7. The curable organopolysiloxane composition according to claim 1, which is a two-liquid type curable organopolysiloxane composition.

8. The curable organopolysiloxane composition according to claim 7, wherein a first-liquid component comprises at least components (E) and (F), and optionally contains part of component (A), while a second-liquid component comprises at least components (B), (C), (D), and (G), as well as the remaining amount of component (A).

9. A protectant or adhesive composition of electric/electronic parts, comprising: the curable organopolysiloxane composition according to claim 1.

10. Electric/electronic equipment, wherein electric/electronic parts are obtained by encapsulating or sealing the curable organopolysiloxane composition according to claim 1.

11. Electric/electronic equipment, comprising a cured product obtained by curing the curable organopolysiloxane composition according to claim 1.

12. The electric/electronic equipment according to claim 11, wherein thickness of the cured product is within the range of 10 to 500 μm.

* * * * *